(12) United States Patent
Yoshioka

(10) Patent No.: US 11,158,362 B2
(45) Date of Patent: Oct. 26, 2021

(54) SEMICONDUCTOR MEMORY DEVICE

(71) Applicant: FUJITSU SEMICONDUCTOR MEMORY SOLUTION LIMITED, Yokohama (JP)

(72) Inventor: Hiroshi Yoshioka, Kunitachi (JP)

(73) Assignee: FUJITSU SEMICONDUCTOR MEMORY SOLUTION LIMITED, Yokohama (JP)

( * ) Notice: Subject to any disclaimer, the term of this patent is extended or adjusted under 35 U.S.C. 154(b) by 0 days.

(21) Appl. No.: 17/022,639

(22) Filed: Sep. 16, 2020

(65) Prior Publication Data

US 2021/0118481 A1    Apr. 22, 2021

(30) Foreign Application Priority Data

Oct. 17, 2019  (JP) .............................. JP2019-190225

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC ........................... G11C 11/2273; G11C 11/221
See application file for complete search history.

(56) References Cited

U.S. PATENT DOCUMENTS

| 6,128,213 | A | * | 10/2000 | Kang | ........................ | G11C 8/08 |
| | | | | | | 365/145 |
| 6,285,576 | B1 | | 9/2001 | Kang | | |
| 2007/0242535 | A1 | * | 10/2007 | Kajigaya | ................. | H01L 24/48 |
| | | | | | | 365/189.09 |
| 2012/0033495 | A1 | * | 2/2012 | Kato | ..................... | G11C 16/344 |
| | | | | | | 365/185.05 |

(Continued)

FOREIGN PATENT DOCUMENTS

| JP | 2001-118380 A | 4/2001 |
| JP | 2018-181394 A | 11/2018 |

OTHER PUBLICATIONS

Barth et al., "A 500MHz Random Cycle 1.5ns-Latency, SOI Embedded DRAM Macro Featuring a 3T Micro Sense Amplifier", ISSCC 2007 / Session 27 / DRAM and eRAM / 27.1, Feb. 14, 2007, pp. 486-487 and 617. Cited in Specification. (3 pages).

*Primary Examiner* — Tuan T Nguyen
(74) *Attorney, Agent, or Firm* — Westerman, Hattori, Daniels & Adrian, LLP

(57) ABSTRACT

Each pre-sense amplifier produces, in a read operation, an output potential obtained by resistively dividing a power supply voltage based on a potential of one of two first bit lines or one of a plurality of second bit lines. The two first bit lines are connected to a first memory cell holding data of a first and a second logic values. The second bit lines are individually connected to one of a plurality of second memory cells each holding data of the first or the second logic value. Each twin sense amplifier outputs, in the read (Continued)

operation, data determination results based on two reference potentials and a data potential. The two reference potentials are the output potentials produced based on the potentials of the two first bit lines. The data potential is the output potential produced based on the potential of one of the second bit lines.

9 Claims, 13 Drawing Sheets

(56) References Cited

U.S. PATENT DOCUMENTS

| | | | |
|---|---|---|---|
| 2014/0063904 A1* | 3/2014 | Yon | G11C 7/16 365/148 |
| 2018/0226116 A1* | 8/2018 | Derner | G06F 3/0619 |
| 2018/0301180 A1 | 10/2018 | Sano | |

* cited by examiner

SEMICONDUCTOR MEMORY DEVICE

CROSS-REFERENCE TO RELATED APPLICATION

This application is based upon and claims the benefit of priority of the prior Japanese Patent Application No. 2019-190225, filed on Oct. 17, 2019, the entire contents of which are incorporated herein by reference.

FIELD

The embodiments discussed herein are related to a semiconductor memory device.

BACKGROUND

In a semiconductor memory device having memory cells provided with capacitors, electric charge stored in a capacitor is read out onto a bit line, and voltage corresponding to the amount of the stored electric charge is amplified by a sense amplifier. One example of such a semiconductor memory device is a ferroelectric random access memory (FeRAM) using ferroelectric capacitors as capacitors.

In addition, there has conventionally been proposed a semiconductor memory device using readout circuits called twin sense amplifiers. Each twin sense amplifier includes a sense amplifier for amplifying a potential difference between a reference potential of a logic "0" value and a data potential and a sense amplifier for amplifying a potential difference between a reference potential of a logic "1" value and the data potential, where the output terminals of the two sense amplifiers are short-circuited. The data potential is supplied via a bit line to the twin sense amplifier, for example, from a memory cell including one transistor and one capacitor (1T1C cell). The reference potentials of the logic 0 and 1 values are supplied via two bit lines to the twin sense amplifier, for example, from a memory cell including two transistors and two capacitors holding data complementary to each other (2T2C cell). Because the output terminals of the two sense amplifiers are short-circuited, one sense amplifier for amplifying a potential difference between the data potential and one of the two reference potentials, having a larger potential difference from the data potential, first provides a strong amplification and causes the other sense amplifier to follow, to thereby determine data. The use of such twin sense amplifiers results in an improved read margin.

There is a proposed technology of amplifying a reference potential before inputting it into each sense amplifier in order to prevent the reference potential from being depleted and therefore becoming unstable due to an increased number of accesses to a reference cell holding the reference potential (see, for example, Japanese Laid-open Patent Publication No. 2001-118380; and John Barth et al., "A 500 MHz Random Cycle 1.5 ns-Latency, SOI Embedded DRAM Macro Featuring a 3T Micro Sense Amplifier", ISSCC2007, Digest of Technical Papers, February, 2007, pp. 485-487). There is also a proposed technology of reducing bit line parasitic capacitance in a ferroelectric memory by organizing bit lines into a hierarchical structure via switches and thereby reducing the length of the bit lines (see, for example, Japanese Laid-open Patent Publication No. 2018-181394).

In a semiconductor memory device using the above-cited twin sense amplifiers, a data potential is supplied to a single twin sense amplifier via a bit line connected to a data cell. On the other hand, a reference potential is supplied to all the twin sense amplifiers via a bit line connected to a reference cell. For this reason, a heavier load is placed on the bit line connected to the reference cell compared to the bit line connected to the data cell, which compromises the accuracy of the reference potential, thus leading to possible data determination errors.

SUMMARY

According to one aspect, there is provided a semiconductor memory device including a memory cell array configured to include a first memory cell holding data of a first logic value and a second logic value, a plurality of second memory cells each holding data of the first logic value or the second logic value, two first bit lines connected to the first memory cell, and a plurality of second bit lines each connected to one of the plurality of second memory cells; a plurality of pre-sense amplifiers, each configured to produce, in a read operation, an output potential obtained by resistively dividing a power supply voltage based on a potential of one of the two first bit lines or one of the plurality of second bit lines; and a plurality of twin sense amplifiers, each configured to output data determination results based on two reference potentials and a data potential in the read operation, the two reference potentials being the output potentials produced based on the potentials of the two first bit lines, the data potential being the output potential produced based on the potential of one of the plurality of second bit lines.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

(a) First Embodiment

Figure 1:
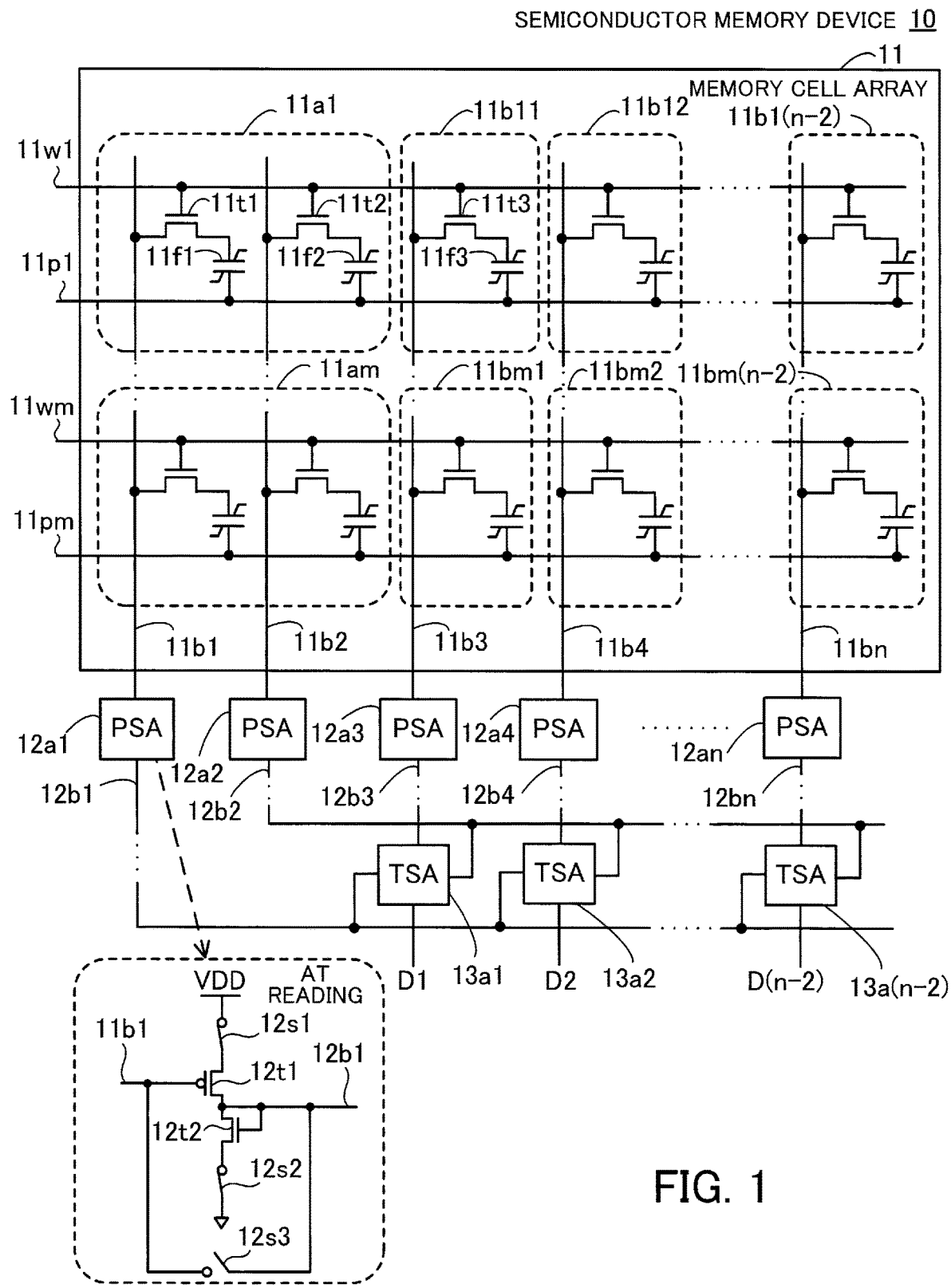
FIG. 1 illustrates an exemplary semiconductor memory device according to a first embodiment.

FIG. 1 illustrates an exemplary semiconductor memory device according to a first embodiment.

A semiconductor memory device 10 is, for example, a FeRAM and includes a memory cell array 11, pre-sense amplifiers 12a1, 12a2, 12a3, 12a4, . . . , and 12an, and twin sense amplifiers 13a1, 13a2, . . . , and 13a(n−2). Note that, in FIG. 1, a pre-sense amplifier and twin sense amplifier are abbreviated as "PSA" and "TSA", respectively. Other components (e.g. a column decoder and row decoder) of the semiconductor memory device 10 are not illustrated in FIG. 1.

The memory cell array 11 includes memory cells 11a1 to 11am each holding complementary data of logic 0 and 1 values. These memory cells 11a1 to 11am are used as reference cells to provide reference potentials to the twin sense amplifiers 13a1 to 13a(n−2). The memory cell array 11 also includes memory cells 11b1, 11b12, . . . , 11b1(n−2), . . . , 11bm1, 11bm2, . . . , and 11bm(n−2), each holding data of a logic 0 or 1 value. These memory cells 11b11 to 11bm(n−2) are used as data cells to provide data potentials to the twin sense amplifiers 13a1 to 13a(n−2).

In the example of FIG. 1, the memory cells 11a1 to 11am are made up of 2T2C memory cells while the memory cells 11b1 to 11bm(n−2) are made up of 1T1C memory cells. The use of 1T1C memory cells as the data cells increases memory capacity while preventing an increase in circuit area.

Further, the memory cell array 11 also includes bit lines and the like, connected to the individual memory cells.

FIG. 1 represents examples of the individual memory cells.

The 2T2C memory cell 11a1 includes transistors 11t1 and 11t2, which are n-channel field-effect transistors (e.g. metal-oxide-semiconductor field-effect transistors (MOSFETs)), and ferroelectric capacitors 11f1 and 11f2. One of the source and drain of the transistor 11t1 is connected to a bit line 11b1, and the other one is connected to one terminal of the ferroelectric capacitor 11f1. One of the source and drain of the transistor 11t2 is connected to a bit line 11b2, and the other one is connected to one terminal of the ferroelectric capacitor 11f2. The gates of the transistors 11t1 and 11t2 are connected to a word line 11w1. The other terminals of the ferroelectric capacitors 11f1 and 11f2 are connected to a plate line 11p1. Such a 2T2C memory cell as described above is connected to each of other pairs of word and plate lines (e.g. a pair of a word line 11wm and a plate line 11pm).

The 1T1C memory cell 11b11 includes a transistor 11t3, which is an n-channel field-effect transistor, and a ferroelectric capacitor 11f3. One of the source and drain of the transistor 11t3 is connected to a bit line 11b3, and the other one is connected to one terminal of the ferroelectric capacitor 11f3. The gate of the transistor 11t3 is connected to the word line 11w1. The other terminal of the ferroelectric capacitor 11f3 is connected to the plate line 11p1. A 1T1C memory cell connected to each of other bit lines 11b4 to 11bn and each of other pairs of word and plate lines (e.g. the pair of the word line 11wm and the plate line 11pm) has the same configuration described above.

The above description assumes that the capacitors of the memory cells are ferroelectric capacitors, but are not limited to them. For example, in the case of a dynamic random access memory (DRAM), capacitors other than ferroelectric capacitors are used and the plate lines are kept at a ground potential.

FIG. 1 depicts the memory cell array 11 with a plurality of paired word and plate lines; however, the memory cell array may include only one pair of word and plate lines. In that case, there is provided a single 2T2C memory cell functioning as a reference cell.

Each of the pre-sense amplifiers 12a1 to 12an produces an output potential obtained by resistively dividing a power supply voltage VDD based on a potential of one of the bit lines 11b1 to 11bn in a memory read operation.

FIG. 1 depicts an example of the pre-sense amplifier 12a1. The pre-sense amplifier 12a1 includes a transistor 12t1 which is a p-channel field-effect transistor, a transistor 12t2 which is an n-channel field-effect transistor, and switches 12s1, 12s2, and 12s3.

The source of the transistor 12t1 is connected to one terminal of the switch 12s1 while the drain thereof is connected to the drain and gate of the transistor 12t2 and a bit line 12b1. The gate of the transistor 12t1 is connected to the bit line 11b1. The source of the transistor 12t2 is connected to one terminal of the switch 12s2. The other terminal of the switch 12s1 is connected to a power source, and the other terminal of the switch 12s2 is grounded. One terminal of the switch 12s3 is connected to the bit line 11b1 and the other terminal is connected to the bit line 12b1. At reading, the switches 12s1 and 12s2 turn on while the switch 12s3 turns off. Herewith, the power supply voltage VDD is applied to the source of the transistor 12t1, and the source of the transistor 12t2 drops to the ground potential. Then, based on the potential of the bit line 11b1 (an input potential) an output potential obtained by resistively dividing the power supply voltage VDD by the transistors 12t1 and 12t2 appears at the drain of the transistor 12t1 and the bit line 12b1. At writing, the switches 12s1 and 12s2 turn off while the switch 12s3 turns on.

Each of the remaining pre-sense amplifiers 12a2 to 12an is also made up of the same circuit configuration as that of the pre-sense amplifier 12a1.

Figure 2:
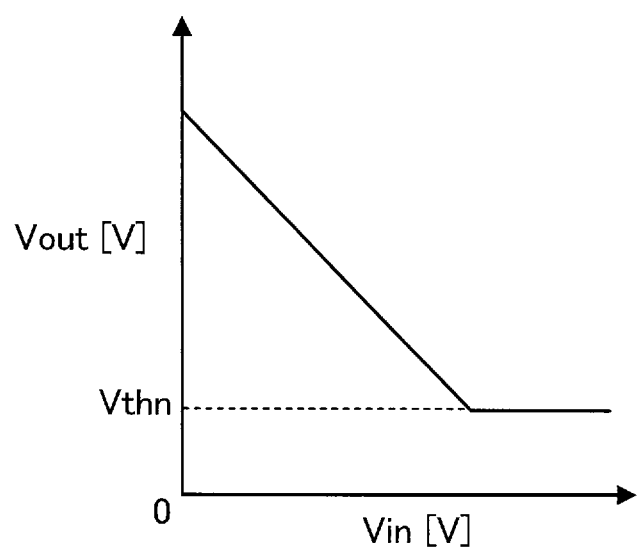
FIG. 2 illustrates an exemplary relationship between an input potential and an output potential of a pre-sense amplifier.

FIG. 2 illustrates an exemplary relationship between an input potential and an output potential of a pre-sense amplifier. In FIG. 2, the vertical axis represents an output potential Vout [V], and the horizontal axis represents an input potential Vin [V].

When the input potential Vin is 0 V, both the transistors 12t1 and 12t2 turn on and function as a current source so a current flows between the power source and the ground. At this time, the output potential Vout, which is generated by resistively dividing the power supply voltage VDD by ON resistances of the transistors 12t1 and 12t2, reaches its maximum. As the input potential Vin increases, the ON resistance of the transistor 12t1 increases and the output potential Vout therefore decreases. Note however that the output potential Vout does not fall below a threshold voltage Vthn of the transistor 12t2.

Therefore, the absolute value of the amplitude of the input potential Vin is greater than that of the output potential Vout (i.e., the gain is smaller than 1).

Referring back to FIG. 1, the twin sense amplifiers 13a1 to 13a(n−2) are individually connected to the pre-sense amplifiers 12a1 and 12a2 via the bit lines 12b1 and 12b2. Further, each of the twin sense amplifiers 13a1 to 13a(n−2) is connected to one of the pre-sense amplifiers 12a3 to 12an via one of bit lines 12b3, 12b4, . . . , and 12bn.

The twin sense amplifiers 13a1 to 13a(n−2) individually receive two reference potentials, which are output potentials produced by the pre-sense amplifiers 12a1 and 12a2 based on the potentials of the bit lines 11b1 and 11b2. Further, each of the twin sense amplifiers 13a1 to 13a(n−2) receives a data potential, which is an output potential produced by one of the pre-sense amplifiers 12a3 to 12an based on the potential of one of the bit lines 11b3 to 11bn. Then, the twin sense amplifiers 13a1 to 13a(n−2) individually output data determination results D1, D2, . . . , and D(n−2) based on the two reference potentials and the data potential.

Next described is an exemplary read operation of the semiconductor memory device 10.

For example, in the case of reading data held in the memory cell 11b1, the word line 11w1 and the plate line 11p1 are activated. Further, by a column decoder (not illustrated), the bit lines 12b1 to 12b3 are connected to the twin sense amplifier 13a1.

At this time, a potential corresponding to a logic value of the data held in the memory cell 11b1 appears on the bit line 11b3. Then, based on the potential of the bit line 11b3, the pre-sense amplifier 12a3 produces an output potential Vout, which is generated by resistively dividing the power supply voltage VDD, as a data potential.

In addition, potentials corresponding to data of logic 0 and 1 values held in the memory cell 11a1 appear on the bit lines 11b1 and 11b2. Then, based on these potentials, the pre-sense amplifiers 12a1 and 12a2 produce output potentials Vout, which are generated by resistively dividing the power supply voltage VDD, as two reference potentials.

In the twin sense amplifier 13a1, a sense amplifier for amplifying a potential difference between the data potential and one of the two reference potentials, having a larger potential difference from the data potential, first provides a strong amplification and causes the other sense amplifier to follow, to thereby determine the data. The determined data is output as the data determination results D1.

According to the semiconductor memory device 10 described above, the output potentials of the pre-sense amplifiers 12a to 12an are based on the potentials of the bit lines 11b1 to 11bn, independent of load on the bit lines 12b1 to 12bn. This is because the output potentials of the pre-sense amplifiers 12a1 to 12an are obtained by resistively dividing the power supply voltage VDD at a division ratio according to the potentials of the bit lines 11b1 to 11bn.

That is, the differences in load on the bit lines 12b1 to 12bn are negated, which thus prevents a difference from arising between potentials corresponding to data of the same logic value read from the reference cell and the data cell. Herewith, it is possible to control the occurrence of data determination errors made by the twin sense amplifiers 13a1 to 13a(n−2).

As for the pre-sense amplifiers 12a1 to 12an, the input potential rises from 0 V to a level according to a logic value. Therefore, it is preferable to have a circuit configuration in which the input potential is applied to the gate of the transistor 12t1, which is a p-channel field-effect transistor, as illustrated in FIG. 1.

Note however that the circuit configuration of the pre-sense amplifiers 12a1 to 12an is not limited to the example of FIG. 1.

Note that, in the example of FIG. 1, the reference cells do not function as data cells. However, they may also be used as data cells, and in that case, a twin sense amplifier is added. An example where one of two 1T1C memory cells serving as reference cells is also used as a data cell is described later (see FIG. 10).

Figure 3:
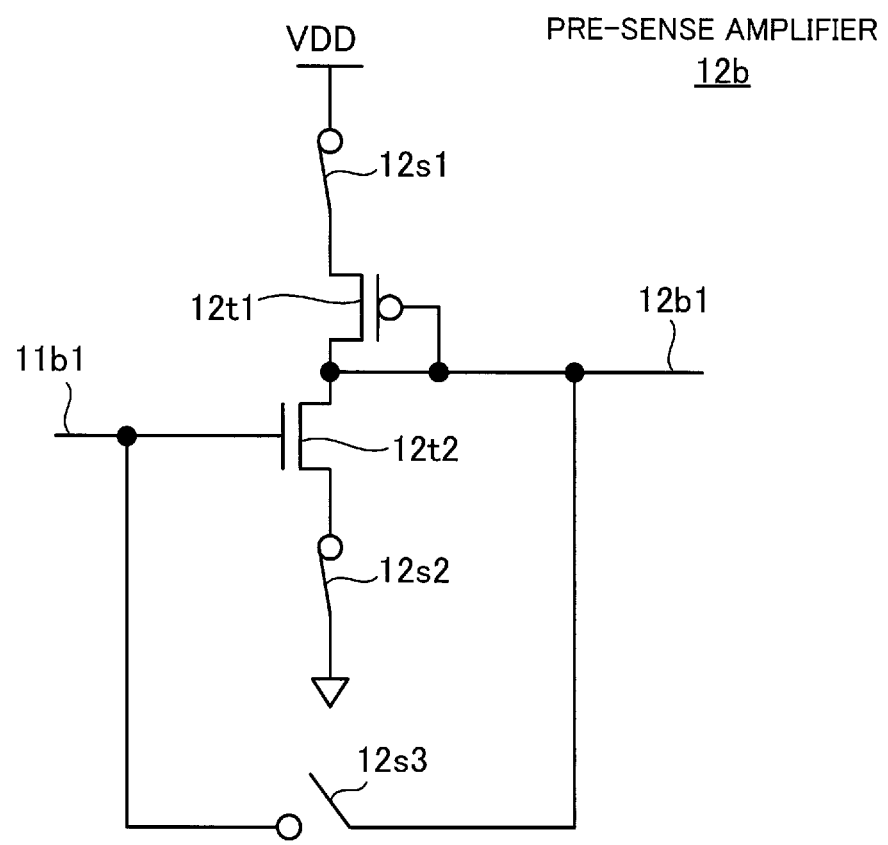
FIG. 3 illustrates a first modified pre-sense amplifier.

FIG. 3 illustrates a first modified pre-sense amplifier.

A pre-sense amplifier 12b includes the transistor 12t1 which is a p-channel field-effect transistor, the transistor 12t2 which is an n-channel field-effect transistor, and the switches 12s1, 12s2, and 12s3, as in the case of the pre-sense amplifier 12a1 of FIG. 1. Note however that, in the pre-sense amplifier 12b, connection arrangements for the transistors 12t1 and 12t2 are different from those in the pre-sense amplifier 12a1.

As in the case of the pre-sense amplifier 12a1, the source of the transistor 12t1 is connected to the one terminal of the switch 12s1; however, the drain of the transistor 12t1 is connected to its own gate, the drain of the transistor 12t2, and the bit line 12b1. In addition, the source of the transistor 12t2 is connected to the one terminal of the switch 12s2 as in the case of the pre-sense amplifier 12a1; however, the gate of the transistor 12t2 is connected to the bit line 11b1.

Figure 4:
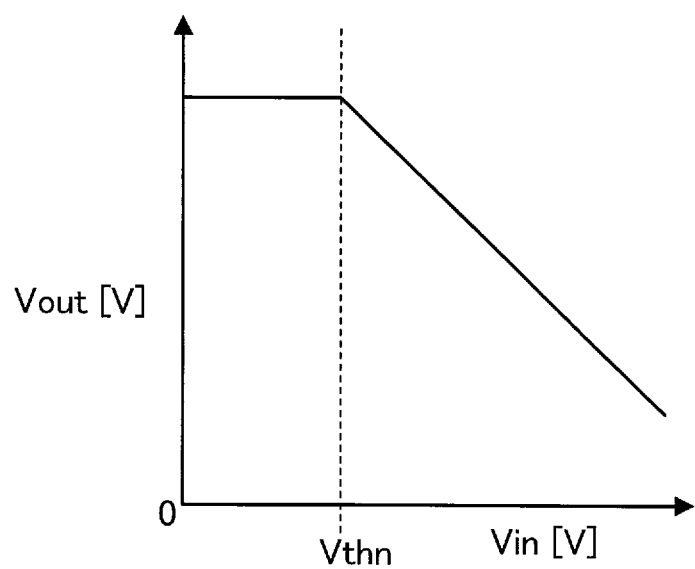
FIG. 4 illustrates an exemplary relationship between an input potential and an output potential of the first modified pre-sense amplifier.

FIG. 4 illustrates an exemplary relationship between an input potential and an output potential of the first modified pre-sense amplifier. In FIG. 4, the vertical axis represents an output potential Vout [V], and the horizontal axis represents an input potential Vin [V].

When the input potential Vin is 0 V, the transistor 12t1 turns on and the transistor 12t2 turns off. When the input potential Vin reaches or exceeds a threshold voltage Vthn of the transistor 12t2, both the transistors 12t1 and 12t2 are on and function as a current source so a current flows between the power source and the ground. As the input potential Vin increases, the ON resistance of the transistor 12t2 decreases and the output potential Vout therefore decreases.

In the case of the pre-sense amplifier 12b, the output potential Vout also remains unchanged unless the input potential Vin reaches or exceeds the threshold voltage Vthn. Therefore, the absolute value of the amplitude of the input potential Vin is greater than that of the output potential Vout (i.e., the gain is smaller than 1).

Figure 5:
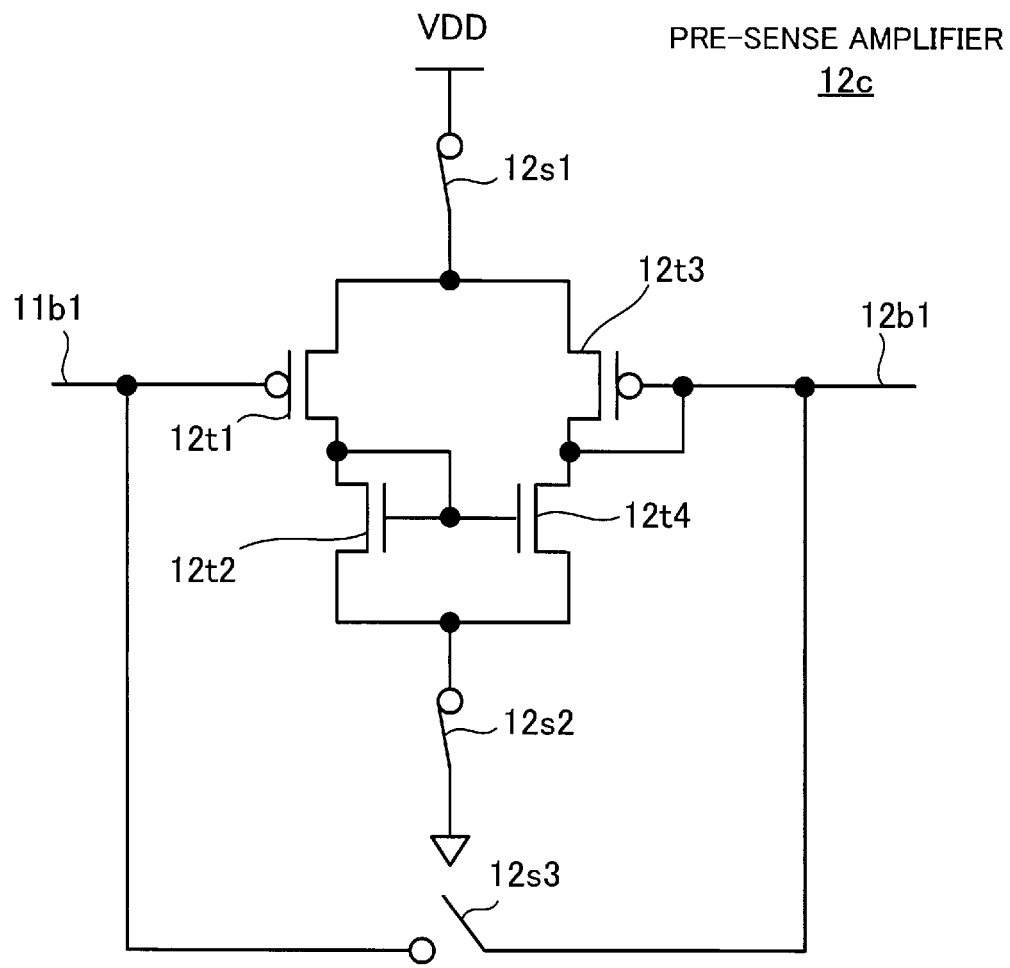
FIG. 5 illustrates a second modified pre-sense amplifier.

FIG. 5 illustrates a second modified pre-sense amplifier.

A pre-sense amplifier 12c further includes a transistor 12t3 which is a p-channel field-effect transistor and a transistor 12t4 which is an n-channel field-effect transistor, in addition to the individual components of the pre-sense amplifiers 12a1 and 12b. The pre-sense amplifier 12c has a circuit configuration as follows.

The sources of the transistors 12t1 and 12t3 are connected to the one terminal of the switch 12s1, and the drain of the transistor 12t1 is connected to the drain of the transistor 12t2 and the gates of the transistors 12t2 and 12t4. The gate of the transistor 12t1 is connected to the bit line 11b1. The drain of the transistor 12t3 is connected to its own gate and the drain of the transistor 12t4, and the gate of the transistor 12t3 is connected to the bit line 12b1. The gates of the transistors 12t2 and 12t4 are connected to each other while their sources are connected to the one terminal of the switch 12s2.

At reading, the switches 12s1 and 12s2 turn on and the switch 12s3 turns off, and thereby the pre-sense amplifier 12c described above serves as a current mirror.

Figure 6:
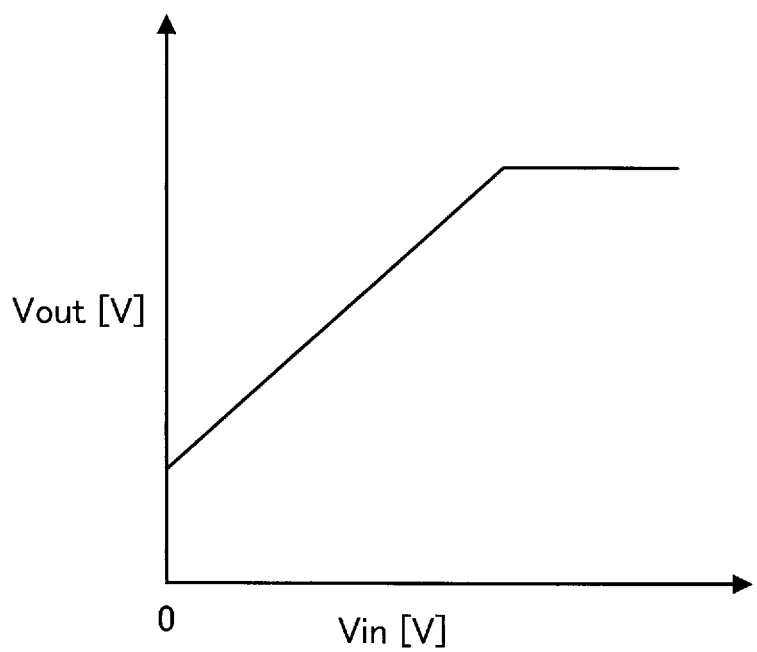
FIG. 6 illustrates an exemplary relationship between an input potential and an output potential of the second modified pre-sense amplifier.

FIG. 6 illustrates an exemplary relationship between an input potential and an output potential of the second modified pre-sense amplifier. In FIG. 6, the vertical axis represents an output potential Vout [V], and the horizontal axis represents an input potential Vin [V].

When the input potential Vin is 0 V, the transistors 12t1 to 12t4 turn on and function as a current source so a current flows between the power source and the ground. At this time, the output potential Vout (the gate potential of the transistor 12t3 and the drain potential of the transistor 12t4) is generated by resistively dividing the power supply voltage VDD by ON resistances of the transistors 12t3 and 12t4. As the input potential Vin increases, the ON resistance of the transistor 12t1 increases and the drain potential and the gate potential of the transistor 12t2 decrease. As a result, the ON resistances of the transistors 12t2 and 12t4 increase and the output potential Vout therefore increases. Note however that when the gate potentials of the transistor 12t2 and 12t4 fall to a threshold voltage Vthn thereof, the output potential Vout does not increase further and stays constant.

In the case of the pre-sense amplifier 12c, the output potential Vout becomes constant when the input potential Vin reaches or exceeds a predetermined potential. Therefore, the absolute value of the amplitude of the input potential Vin is greater than that of the output potential Vout (i.e., the gain is smaller than 1).

Figure 7:
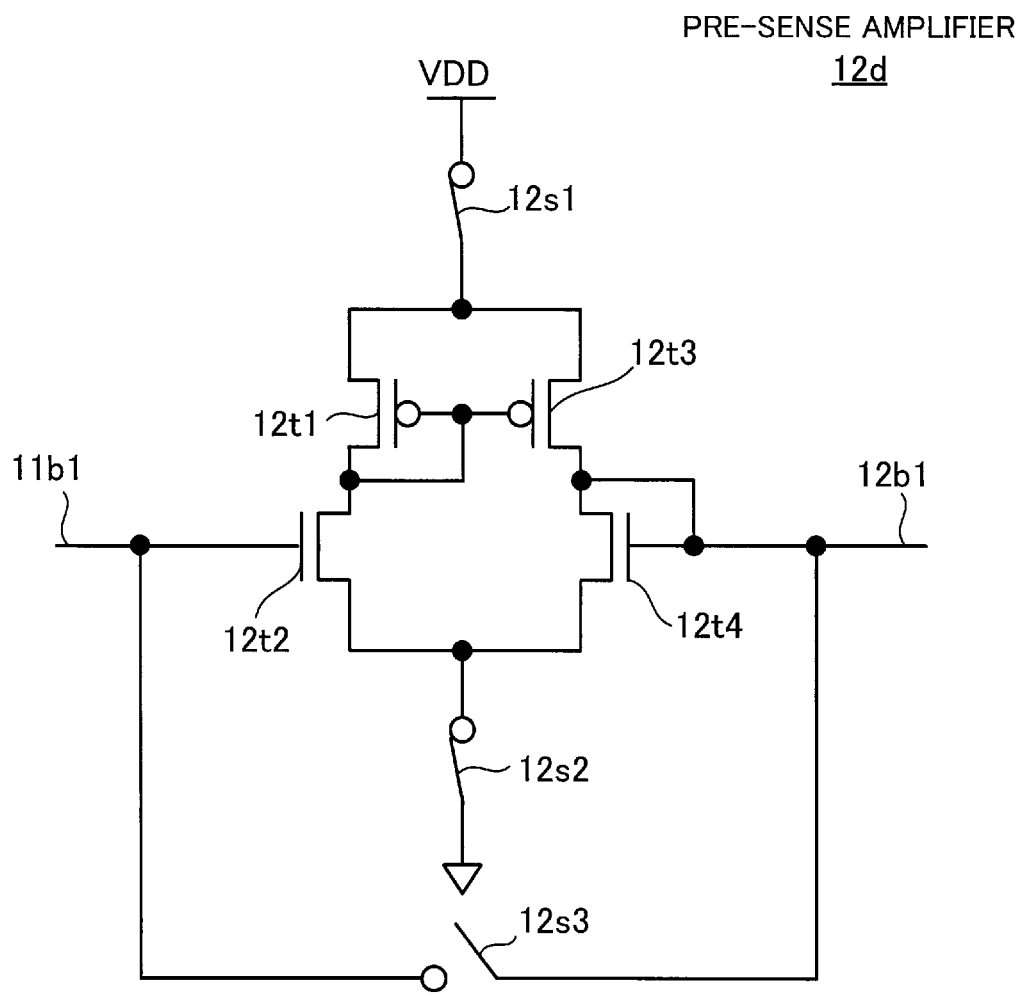
FIG. 7 illustrates a third modified pre-sense amplifier.

FIG. 7 illustrates a third modified pre-sense amplifier.

A pre-sense amplifier 12d includes the transistors 12t1 and 12t3 which are p-channel field-effect transistors, the transistor 12t2 and 12t4 which are n-channel field-effect transistors, and the switches 12s1, 12s2, and 12s3, as in the case of the pre-sense amplifier 12c of FIG. 5. Note however that, in the pre-sense amplifier 12d, connection arrangements for the transistors 12t1 to 12t4 are different from those in the pre-sense amplifier 12c.

As in the case of the pre-sense amplifier 12c, the sources of the transistors 12t1 and 12t3 are connected to the one terminal of the switch 12s1; however, the drain of the transistor 12t1 is connected to the drain of the transistor 12t2 and the gates of the transistors 12t1 and 12t3. The gates of the transistors 12t1 and 12t3 are connected to each other. The drain of the transistor 12t3 is connected to the drain and gate of the transistor 12t4 and the bit line 12b1. The gate of the transistor 12t2 is connected to the bit line 11b1. The sources of the transistors 12t2 and 12t4 are connected to the one terminal of the switch 12s2.

At reading, the switches 12s1 and 12s2 turn on and the switch 12s3 turns off, and thereby the pre-sense amplifier 12d described above also serves as a current mirror, as in the case of the pre-sense amplifier 12c.

Figure 8:
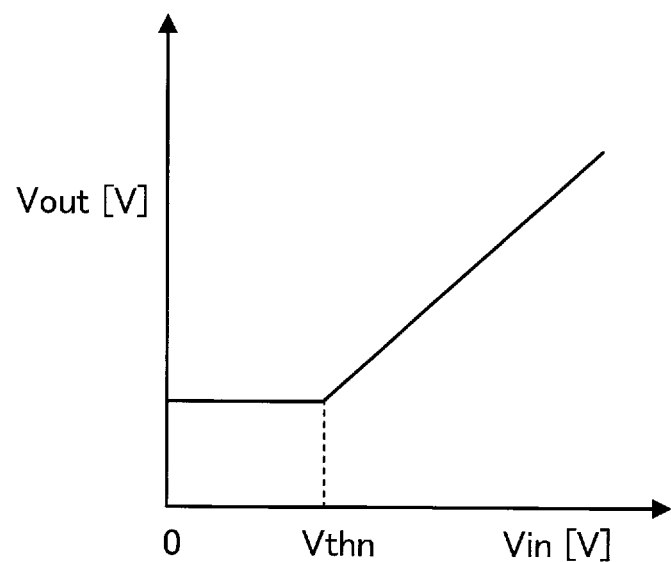
FIG. 8 illustrates an exemplary relationship between an input potential and an output potential of the third modified pre-sense amplifier.

FIG. 8 illustrates an exemplary relationship between an input potential and an output potential of the third modified pre-sense amplifier. In FIG. 8, the vertical axis represents an output potential Vout [V], and the horizontal axis represents an input potential Vin [V].

When the input potential Vin is 0 V, the transistors 12t1 and 12t3 turn on while the transistors 12t2 and 12t4 turn off. When the input potential Vin reaches or exceeds a threshold voltage Vthn of the transistor 12t2, the transistor 12t2 turns on. Further, because the ON resistance of the transistor 12t2 falls as the input potential Vin increases, the gate potentials of the transistors 12t1 and 12t3 decrease. Herewith, the ON resistances of the transistors 12t1 and 12t3 decrease and the output potential Vout therefore increases.

In the case of the pre-sense amplifier 12d, the output potential Vout also stays constant until the input potential Vin reaches or exceeds a predetermined potential. Therefore, the absolute value of the amplitude of the input potential Vin is greater than that of the output potential Vout (i.e., the gain is smaller than 1).

As for the pre-sense amplifiers 12c and 12d, the gain may be adjustable to be 1 or greater by changing the size (gate length and gate width) ratios of the transistors 12t1 and 12t2 and the transistors 12t3 and 12t4. However, the pre-sense amplifiers 12c and 12d have an increased number of transistors compared to the pre-sense amplifiers 12a1 and 12b, thus resulting in an increased circuit area.

(b) Second Embodiment

Figure 9:
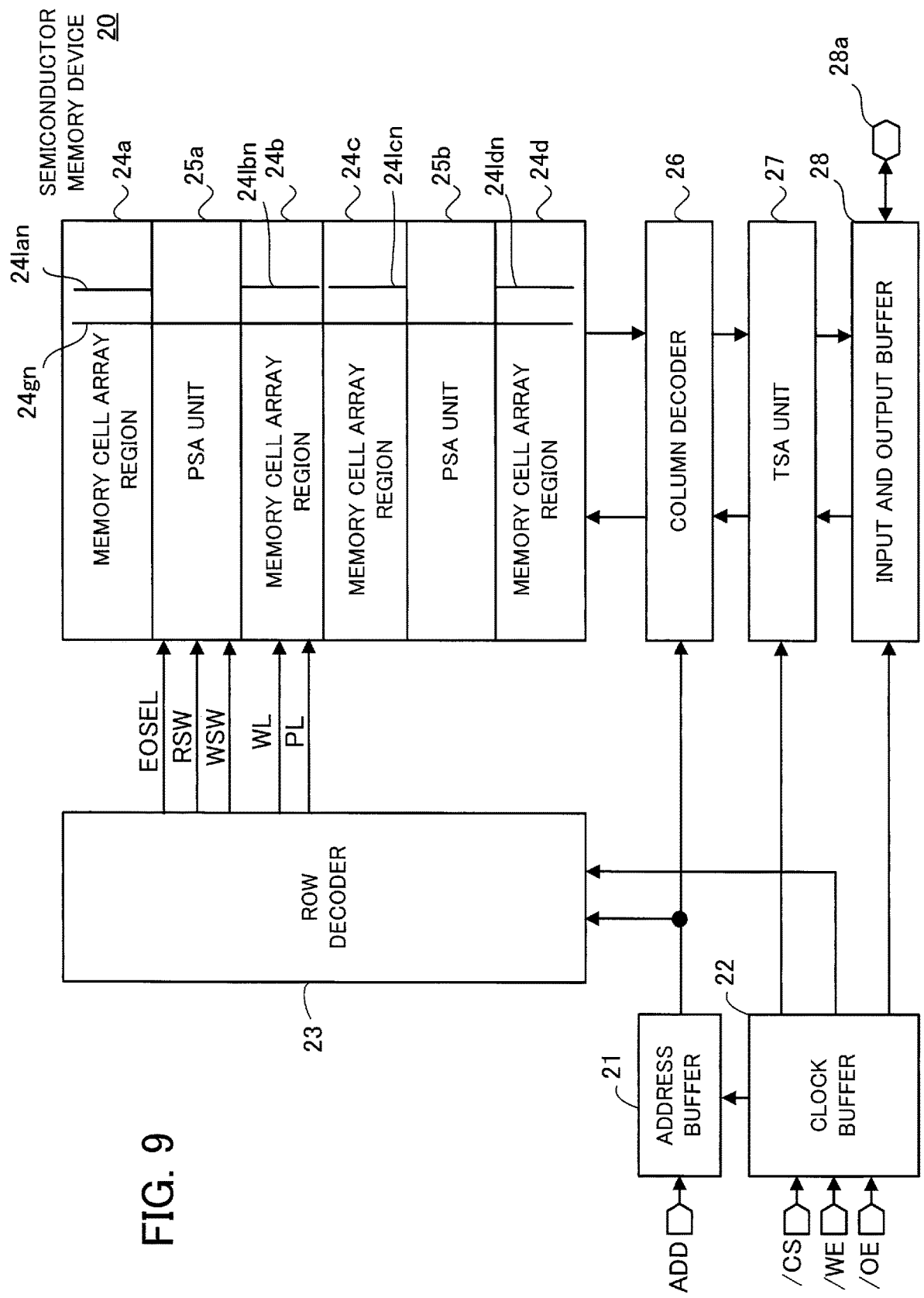
FIG. 9 illustrates an exemplary semiconductor memory device according to a second embodiment.

FIG. 9 illustrates an exemplary semiconductor memory device according to a second embodiment.

A semiconductor memory device 20 according to the second embodiment is, for example, a FeRAM and includes an address buffer 21, a clock buffer 22, a row decoder 23, memory cell array regions 24a, 24b, 24c, and 24d, PSA units 25a and 25b, a column decoder 26, a TSA unit 27, and an input and output buffer 28.

The address buffer 21 holds an address signal ADD supplied from outside the semiconductor memory device 20 and supplies the address signal ADD to the row decoder 23 and the column decoder 26 according to a timing signal supplied from the clock buffer 22.

The clock buffer 22 holds a chip select signal /CS, a write enable signal /WE, and an output enable signal /OE supplied from outside the semiconductor memory device 20. Further, the clock buffer 22 has a function of decoding operation modes indicated by the chip select signal /CS, the write enable signal /WE, and the output enable signal /OE. Then, based on the decoding results, the clock buffer 22 generates various timing signals to operate the address buffer 21, the row decoder 23, the TSA unit 27, and the input and output buffer 28 and provides them to the individual units.

The row decoder 23 generates and outputs signals WL and PL to drive a word line and a plate line designated by a row address included in the address signal ADD (e.g. bits at the high order end of the address signal ADD). Further, based on the row address and the timing signal provided thereto, the row decoder 23 generates and outputs signals EOSEL, RSW, and WSW to control switches to be described later. Note that the row decoder 23 may also output signals /EOSEL, /RSW, and /WSW whose logic levels are the inverse of those of the signals EOSEL, RSW, and WSW.

The memory cell array regions 24a to 24d include a plurality of memory cells arranged in a matrix, a plurality of bit lines, a plurality of word lines, and a plurality of plate lines, as in the case of the memory cell array 11 of FIG. 1 above. Note however that each of the memory cell array regions 24a to 24d includes a plurality of bit lines, independent of each other (hereinafter referred to as "local bit lines"). In addition, the memory cell array regions 24a to 24d are provided with a plurality of bit lines which are shared by the PSA units 25a and 25b ("global bit lines"). In FIG. 9, one global bit line 24gn amongst the plurality of global bit lines is depicted. In addition, in each of the memory cell array regions 24a to 24d, one local bit line 241an, 241bn, 241cn, and 241dn is depicted amongst the plurality of local bit lines individually connected to the memory cells of the memory cell array region.

The PSA units 25a and 25b individually include a plurality of pre-sense amplifiers, each of which produces, at reading, an output potential obtained by resistively dividing the power supply voltage VDD based on the potential of one of a plurality of local bit lines connected to a plurality of memory cells. For example, the PSA unit 25a connects, by a switch (to be described later), to a local bit line (e.g. the local bit line 241an or 241bn) of one of the memory cell array regions 24a and 24b. Then, the PSA unit 25a produces an output potential obtained by resistively dividing the power supply voltage VDD based on the potential of the connected local bit line and applies the produced output potential to a global bit line (e.g. the global bit line 24gn).

In addition, the PSA unit 25*b* connects, by a switch (to be described later), to a local bit line (e.g. the local bit line 241*cn* or 241*dn*) of one of the memory cell array regions 24*c* and 24*d*. Then, the PSA unit 25*b* produces an output potential obtained by resistively dividing the power supply voltage VDD based on the potential of the connected local bit line and applies the produced output potential to a global bit line (e.g. the global bit line 24*gn*).

The column decoder 26 selects, based on a column address included in the address signal ADD (e.g. bits at the low order end of the address signal ADD), a global bit line to be connected to the TSA unit 27.

The TSA unit 27 includes a plurality of twin sense amplifiers, and reads data at a time based on a timing signal provided thereto.

The input and output buffer 28 holds write data supplied from outside the semiconductor memory device 20, and applies, at a time based on a timing signal provided thereto, a voltage corresponding to the write data to a global bit line selected by the column decoder 26. In addition, the input and output buffer 28 outputs, at a time based on a timing signal provided thereto, data read by the TSA unit 27 outside the semiconductor memory device 20.

Figure 10:
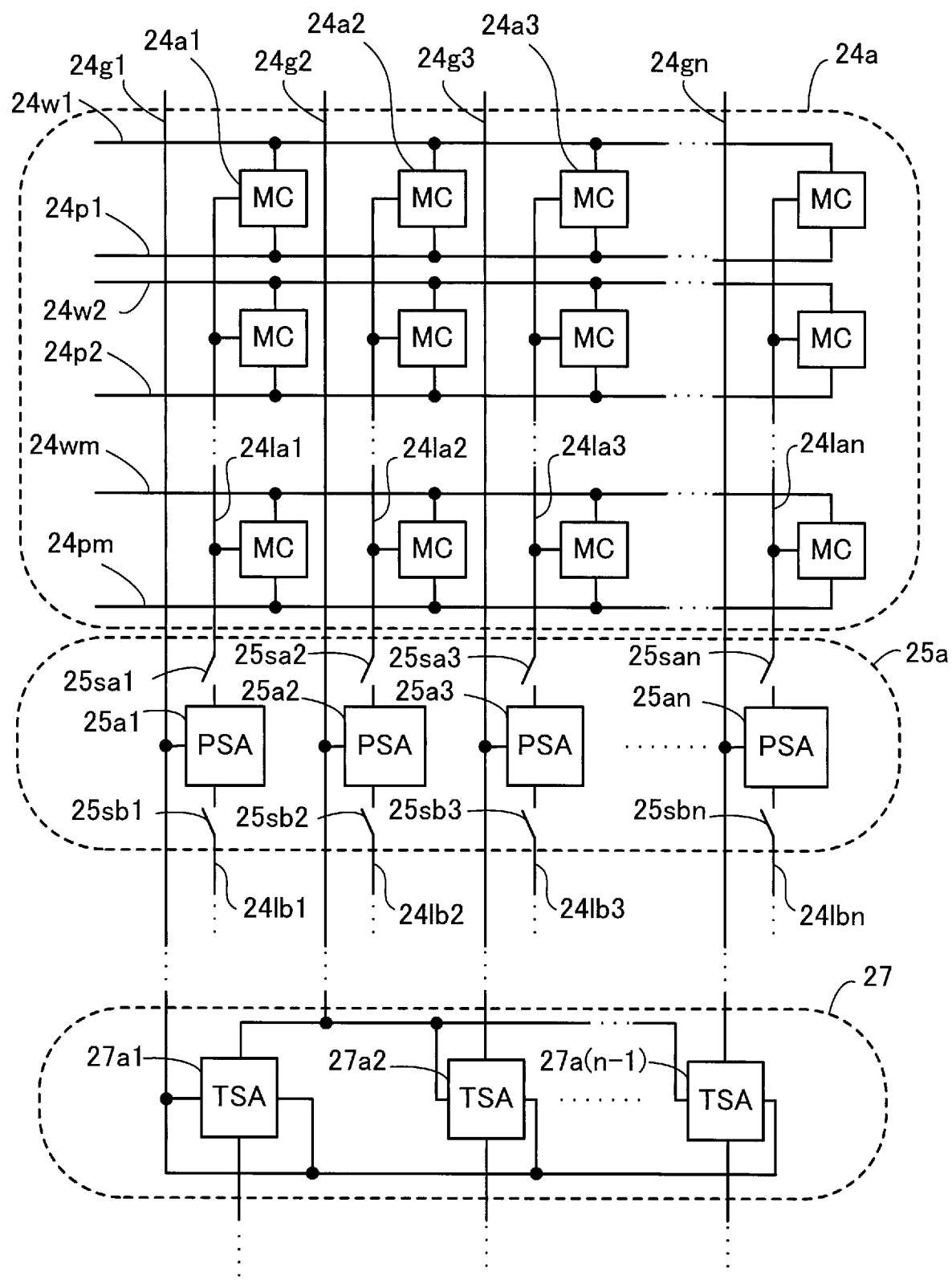
FIG. 10 illustrates exemplary connection of individual bit lines to pre-sense amplifiers and twin sense amplifiers.

FIG. 10 illustrates exemplary connection of individual bit lines to pre-sense amplifiers and twin sense amplifiers.

The memory cell array region 24*a* includes a plurality of memory cells (e.g. memory cells 24*a*1, 24*a*2, and 24*a*3). Each of the memory cells is connected to paired word and plate lines (for example, a pair of a word line 24*w*1 and a plate line 24*p*1, a pair of a word line 24*w*2 and a plate line 24*p*2, and a pair of a word line 24*wm* and a plate line 24*pm*). Further, each of the memory cells is connected to one of local bit lines 241*a*1, 241*a*2, 241*a*3, . . . , and 241*an*.

Note that, in the example of FIG. 10, two 1T1C memory cells (e.g. the memory cells 24*a*1 and 24*a*2) connected to the local bit lines 241*a*1 and 241*a*2 serve as one 2T2C memory cell (reference cell). A single 2T2C memory cell is made up of, for example, the memory cells 24*a*1 and 24*a*2 each storing complementary data. In addition, in the example of FIG. 10, memory cells connected to the local bit line 241*a*2 also serve as data cells.

The PSA unit 25*a* includes pre-sense amplifiers 25*a*1, 25*a*2, 25*a*3, . . . , and 25*an* and switches 25*sa*1, 25*sa*2, 25*sa*3, . . . , 25*san*, 25*sb*1, 25*sb*2, 25*sb*3, . . . , and 25*sbn*.

The pre-sense amplifier 25*a*1 connects to the local bit line 241*a*1 when the switch 25*sa*1 is on, and to the local bit line 241*b*1 when the switch 25*sb*1 is on. The pre-sense amplifier 25*a*2 connects to the local bit line 241*a*2 when the switch 25*sa*2 is on, and to the local bit line 241*b*2 when the switch 25*sb*2 is on. The pre-sense amplifier 25*a*3 connects to the local bit line 241*a*3 when the switch 25*sa*3 is on, and to the local bit line 241*b*3 when the switch 25*sb*3 is on. The pre-sense amplifier 25*an* connects to the local bit line 241*an* when the switch 25*san* is on, and to the local bit line 241*bn* when the switch 25*sbn* is on.

The TSA unit 27 includes twin sense amplifiers 27*a*1, 27*a*2, . . . , and 27*a*(n−1). To the twin sense amplifier 27*a*1, the potential of a global bit line 24*g*1 is supplied as two reference potentials while the potential of a global bit line 24*g*2 is supplied as a data potential. To each of the twin sense amplifiers 27*a*2 to 27*a*(n−1), the potentials of the global bit lines 24*g*1 and 24*g*2 are supplied as two reference potentials while the potential of one of global bit lines 24*g*3 to 24*gn* is supplied as a data potential.

Figure 11:
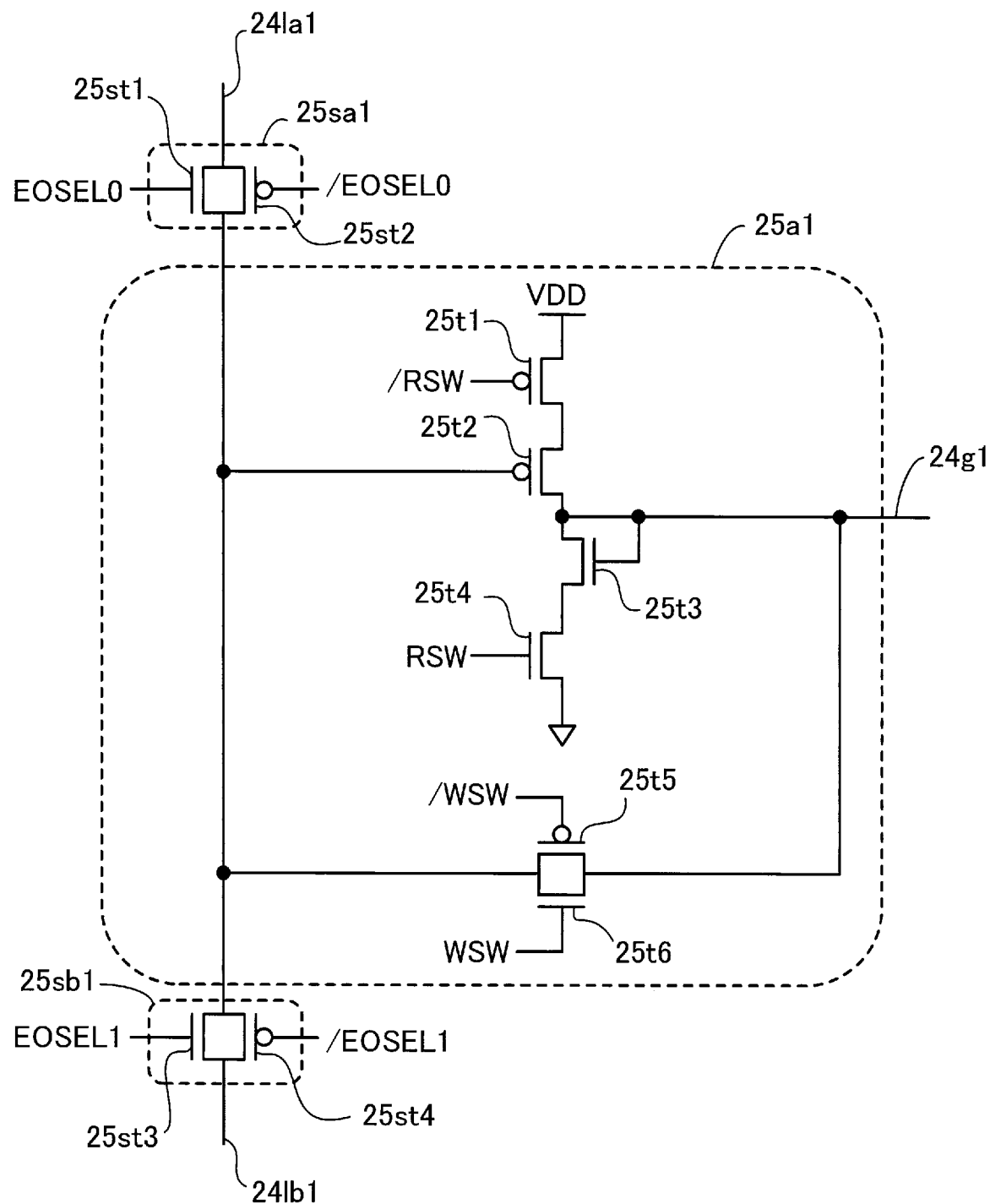
FIG. 11 illustrates exemplary pre-sense amplifier and switches.

FIG. 11 illustrates exemplary pre-sense amplifier and switches. FIG. 11 depicts the pre-sense amplifier 25*a*1 and the switches 25*sa*1 and 25*sb*1 of FIG. 10 as an example. The remaining pre-sense amplifiers 25*a*2 to 25*an* and switches 25*sa*2 to 25*san* and 25*sb*2 to 25*sbn* of FIG. 10 may also be made up of the same circuit configuration.

The pre-sense amplifier 25*a*1 includes transistors 25*t*1, 25*t*2, and 25*t*5 which are p-channel field-effect transistors, and transistors 25*t*3, 25*t*4, and 25*t*6 which are n-channel field-effect transistors.

The source of the transistor 25*t*1 receives the power supply voltage VDD while the gate thereof receives the signal /RSW output from the row decoder 23 and the drain thereof is connected to the source of the transistor 25*t*2. The gate of the transistor 25*t*2 is connected to one terminal of the switch 25*sa*1 and also to one terminal of the switch 25*sb*1, and the drain thereof is connected to the drain and gate of the transistor 25*t*3 and further to the global bit line 24*g*1. The source of the transistor 25*t*3 is connected to the drain of the transistor 25*t*4. The source of the transistor 25*t*4 is grounded, and the gate thereof receives the signal RSW output from the row decoder 23. One of the source and drain of each of the transistors 25*t*5 and 25*t*6 is connected to the one terminals of the switches 25*sa*1 and 25*sb*1 while the other one is connected to the global bit line 24*g*1. The gate of the transistor 25*t*5 receives the signal /WSW output from the row decoder 23 while the gate of the transistor 25*t*6 receives the signal WSW output from the row decoder 23.

The pre-sense amplifier 25*a*1 described above is an example of the pre-sense amplifier 12*a*1 of FIG. 1. In the pre-sense amplifier 25*a*1 of FIG. 11, the transistor 25*t*1 serves as the switch 12*s*1 of FIG. 1, the transistor 25*t*4 serves as the switch 12*s*2 of FIG. 1, and the transistors 25*t*5 and 25*t*6 serve as the switch 12*s*3 of FIG. 1. As the pre-sense amplifiers 25*a*1 to 25*an*, the pre-sense amplifiers 12*b*, 12*c*, and 12*d* of FIGS. 3, 5, and 7 may also be applied.

The switch 25*sa*1 includes a transistor 25*st*1 which is an n-channel field-effect transistor, and a transistor 25*st*2 which is a p-channel field-effect transistor. One of the source and drain of each of the transistors 25*st*1 and 25*st*2 is connected to the local bit line 241*a*1, and the other one is connected to the gate of the transistor 25*t*2, one of the source and drain of each of the transistors 25*t*5 and 25*t*6, and the one terminal of the switch 25*sb*1. The gate of the transistor 25*st*1 receives a signal EOSEL0 output from the row decoder 23, and the gate of the transistor 25*st*2 receives a signal /EOSEL0 output from the row decoder 23. The signals EOSEL0 and /EOSEL0 are examples of the signal EOSEL of FIG. 9, and the signal EOSEL0 is driven to a high logic level when a local bit line of the memory cell array region 24*a* is connected to the PSA unit 25*a*.

The switch 25*sb*1 includes a transistor 25*st*3 which is an n-channel field-effect transistor, and a transistor 25*st*4 which is a p-channel field-effect transistor. One of the source and drain of each of the transistors 25*st*3 and 25*st*4 is connected to the local bit line 241*b*1, and the other one is connected to the gate of the transistor 25*t*2, one of the source and drain of each of the transistors 25*t*5 and 25*t*6, and the one terminal of the switch 25*sa*1. The gate of the transistor 25*st*3 receives a signal EOSEL1 output from the row decoder 23, and the gate of the transistor 25*st*4 receives a signal /EOSEL1 output from the row decoder 23. The signals EOSEL1 and /EOSEL1 are examples of the signal EOSEL of FIG. 9, and the signal EOSEL1 is driven to a high logic level when a local bit line of the memory cell array region 24*b* is connected to the PSA unit 25*a*.

Figure 12:
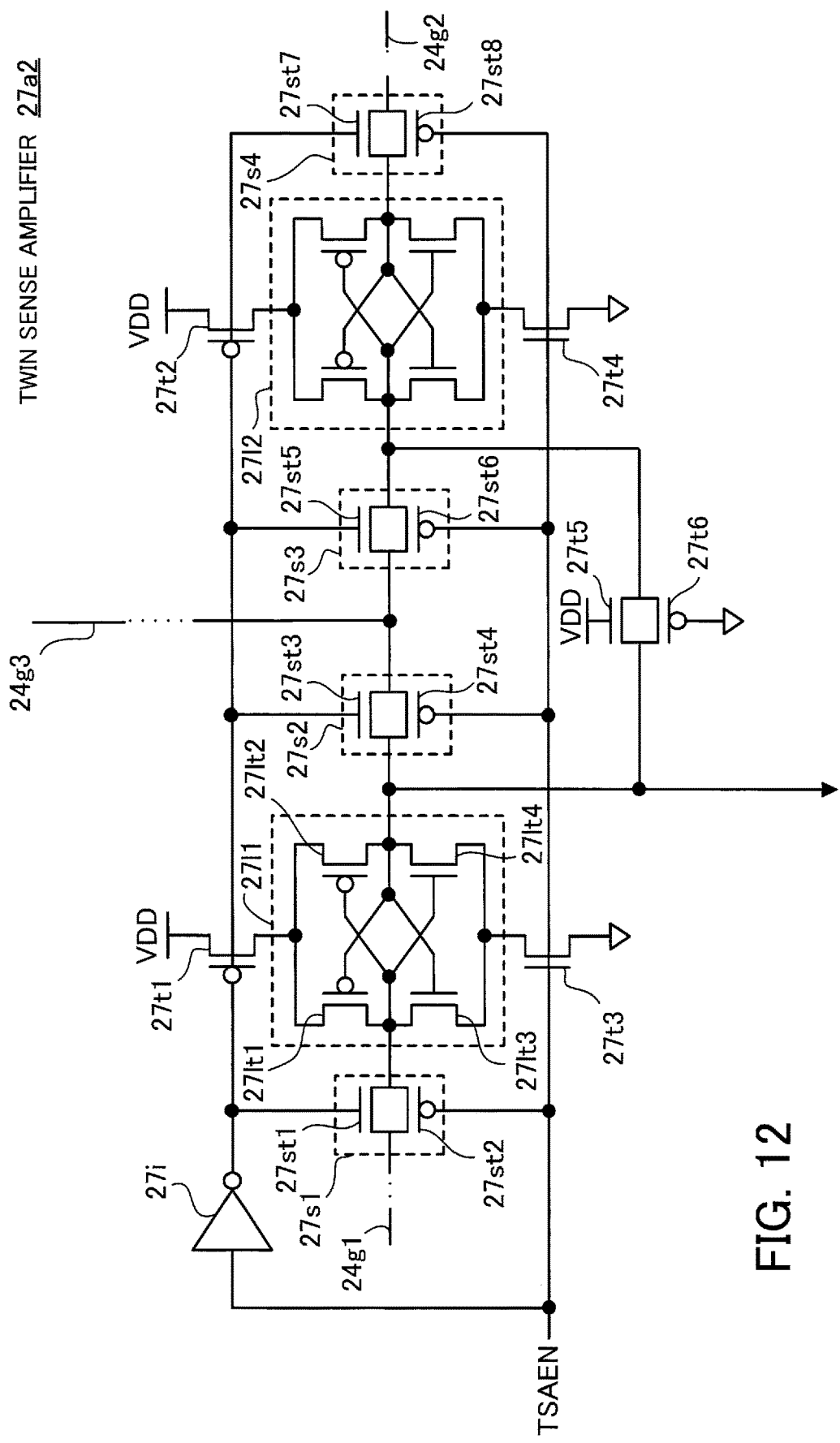
FIG. 12 illustrates an exemplary twin sense amplifier.

FIG. 12 illustrates an exemplary twin sense amplifier. FIG. 12 depicts the twin sense amplifier 27*a*2 of FIG. 10 as an example. The remaining twin sense amplifiers of FIG. 10 may also be made up of the same circuit configuration as the twin sense amplifier 27a2.

The twin sense amplifier 27a2 includes an inverter 27i, transistors 27t1, 27t2, and 27t6 which are p-channel field-effect transistors, and transistors 27t3, 27t4, and 27t5 which are n-channel field-effect transistors. Further, the twin sense amplifier 27a2 includes switches 27s1, 27s2, 27s3, and 27s4 and latch circuits 2711 and 2712.

The inverter 27i outputs a signal obtained by inverting the logic level of a signal TSAEN, which is one of the timing signals output from the clock buffer 22.

The sources of the transistors 27t1 and 27t2 receive the power supply voltage VDD, and the gates thereof receive the output signal of the inverter 27i. The drain of the transistor 27t1 is connected to the latch circuit 2711, and the drain of the transistor 27t2 is connected to the latch circuit 2712. The sources of the transistors 27t3 and 27t4 are grounded, and the gates thereof receive the signal TSAEN. In addition, the drain of the transistor 27t3 is connected to the latch circuit 2711, and the drain of the transistor 27t4 is connected to the latch circuit 2712. One of the source and drain of each of the transistors 27t5 and 27t6 is connected to a node on a wire connecting the latch circuit 2711 and the switch 27s2, and the other one is connected to a node on a wire connecting the latch circuit 2712 and the switch 27s3. The gate of the transistor 27t5 receives the power supply voltage VDD, and the gate of the transistor 27t6 is grounded.

The switch 27s1 includes a transistor 27st1 which is an n-channel field-effect transistor and a transistor 27st2 which is a p-channel field-effect transistor. One of the source and drain of each of the transistors 27st1 and 27st2 is connected to the latch circuit 2711, and the other one is electrically connected to the global bit line 24g1. The gate of the transistor 27st1 receives the output signal of the inverter 27i, and the gate of the transistor 27st2 receives the signal TSAEN.

The switch 27s2 includes a transistor 27st3 which is an n-channel field-effect transistor and a transistor 27st4 which is a p-channel field-effect transistor. One of the source and drain of each of the transistors 27st3 and 27st4 is connected to the latch circuit 2711, and the other one is electrically connected to the global bit line 24g3. The gate of the transistor 27st3 receives the output signal of the inverter 27i, and the gate of the transistor 27st4 receives the signal TSAEN.

The switch 27s3 includes a transistor 27st5 which is an n-channel field-effect transistor and a transistor 27st6 which is a p-channel field-effect transistor. One of the source and drain of each of the transistors 27st5 and 27st6 is connected to the latch circuit 2712, and the other one is electrically connected to the global bit line 24g3. The gate of the transistor 27st5 receives the output signal of the inverter 27i, and the gate of the transistor 27st6 receives the signal TSAEN.

The switch 27s4 includes a transistor 27st7 which is an n-channel field-effect transistor and a transistor 27st8 which is a p-channel field-effect transistor. One of the source and drain of each of the transistors 27st7 and 27st8 is connected to the latch circuit 2712, and the other one is electrically connected to the global bit line 24g2. The gate of the transistor 27st7 receives the output signal of the inverter 27i, and the gate of the transistor 27st8 receives the signal TSAEN.

The latch circuit 2711 includes transistors 271t1 and 271t2 which are p-channel field-effect transistors, and transistors 271t3 and 271t4 which are n-channel field-effect transistors. The sources of the transistors 271t1 and 271t2 serve as power source terminals of the latch circuit 2711 and are connected to the drain of the transistor 27t1. The drain of the transistor 271t1 serves as an input terminal of a reference potential and is connected to the drain of the transistor 271t3, the gates of the transistors 271t2 and 271t4, and the switch 27s1. The drain of the transistor 271t2 serves as an input terminal of a data potential or an output terminal for outputting data determination results, and is connected to the drain of the transistor 271t4, the gates of the transistors 271t1 and 271t3, and the switch 27s2. The sources of the transistors 271t3 and 271t4 are connected to the drain of the transistor 27t3.

The latch circuit 2712 also has the same circuit configuration as the latch circuit 2711.

In the twin sense amplifier 27a2 described above, two reference potentials are supplied via the global bit lines 24g1 and 24g2 while a data potential is supplied via the global bit line 24g3. Then, the data determination results are output, which are represented by the potentials at the output terminals of the latch circuits 2711 and 2712 short-circuited via the transistors 27t5 and 27t6.

Next described is an exemplary operation of the semiconductor memory device 20 according to the second embodiment.

Figure 13:
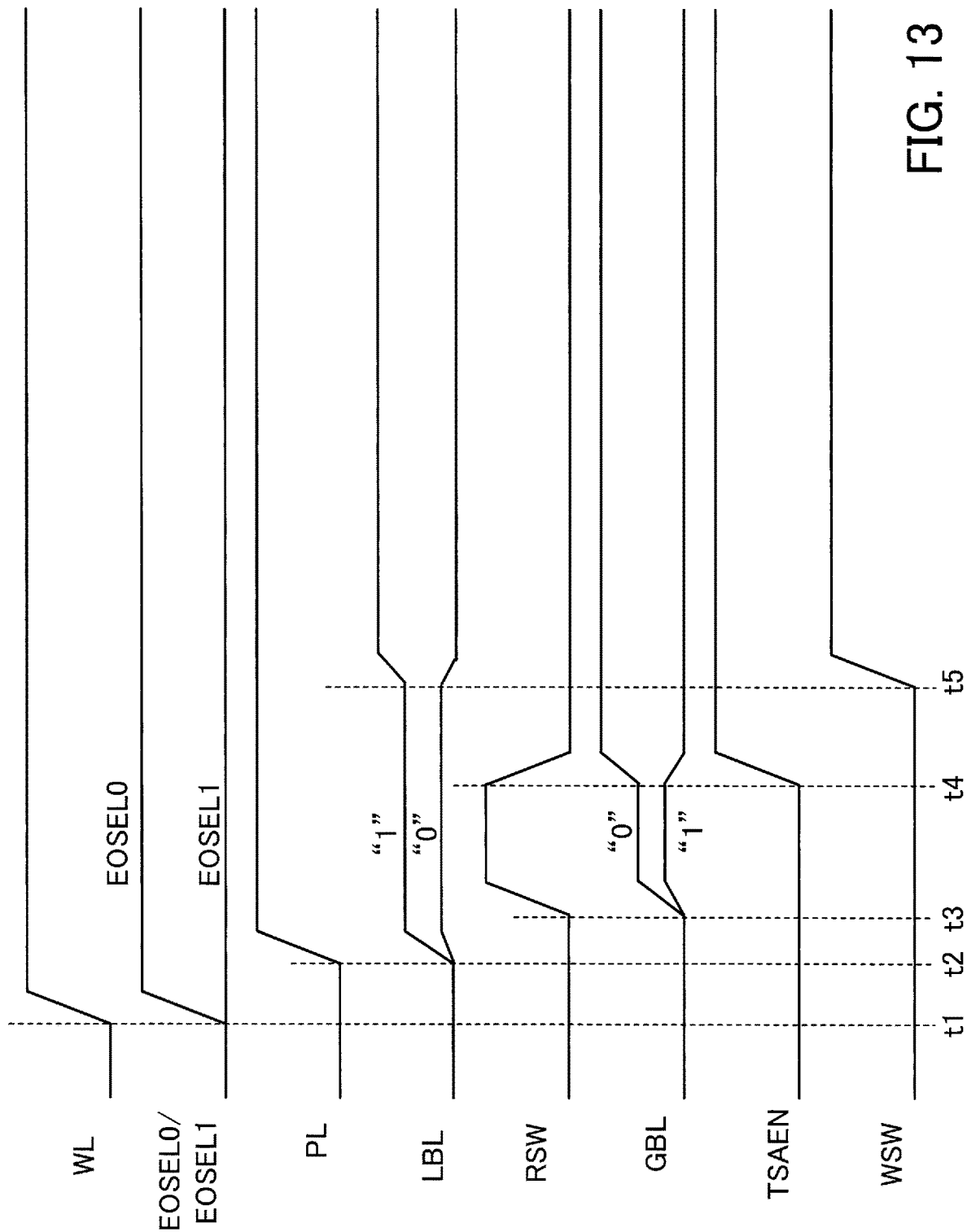
FIG. 13 is a timing diagram illustrating an example of how the semiconductor memory device according to the second embodiment operates.

FIG. 13 is a timing diagram illustrating an example of how the semiconductor memory device according to the second embodiment operates. FIG. 13 depicts temporal changes of the signal WL for driving a word line connected to a memory cell; the above-described signals EOSEL0 and EOSEL1; the signal PL for driving a plate line connected to the foregoing memory cell; and a potential LBL of a local bit line connected to the memory cell. FIG. 13 further depicts temporal changes of the above-described signal RSW; a potential GBL of a global bit line connected to a pre-sense amplifier which is connected to the foregoing local bit line; and the above-described signals TSAEN and WSW.

In the example of FIG. 13, at time t1, the signal WL for driving a word line is activated (the potential rises from low to high), and the signal EOSEL0 is also activated. On the other hand, the signal EOSEL1 is not activated. Herewith, for example, in FIG. 11, the switch 25sa1 turns on while the switch 25sb1 turns off. That is, the local bit line 241a1 and the pre-sense amplifier 25a1 are electrically connected to each other.

Subsequently, at time t2 when the signal PL for driving a plate line is activated, the potential LBL of a local bit line connected to a memory cell which is connected to the plate line rises to a level corresponding to data held in the memory cell. In the example of FIG. 13, when the memory cell holds data of logic 1, the potential LBL rises higher than when data of logic 0 is held therein.

Then, at time t3 when the signal RSW output from the row decoder 23 is activated, a data read operation starts. The activation of the signal RSW puts the transistors 25t1 and 25t4 of FIG. 11 in ON-state. On the other hand, because the signal WSW is at a low level, the transistors 25t5 and 25t6 are in OFF-state.

Herewith, for example, the potential of the global bit line 24g1 of FIG. 11 is set to a level obtained by resistively dividing the power supply voltage VDD based on the potential of the local bit line 241a1. Note that the higher the potential of the local bit line 241a1, the higher the ON resistance of the transistor 25t2, which results in lowering the drain and gate potentials of the transistor 25t3. As a result, the local bit line 241a1 and the global bit line 24g1 have opposite relations of levels of the potentials corresponding to logic 0 and logic 1 to each other. These relations are represented in the potentials LBL and GBL of FIG. 13.

At time t4, the signal RSW is deactivated and the signal TSAEN is activated. This enables, for example, the twin sense amplifier 27a2 of FIG. 12 to perform data determination on data read from the memory cell and output data determination results.

At time t5 when the signal WSW is activated, for example, the transistors 25t5 and 25t6 of FIG. 11 turn on, enabling a write operation (write back). In the write operation, the potential of the global bit line 24g1 is transmitted to the local bit line 241a1, and a logic value corresponding to the potential is written to a memory cell connected to the local bit line 241a1.

According to the above-described semiconductor memory device 20 of the second embodiment, the output potentials of the pre-sense amplifiers 25a1 to 25an are based, for example, on the potentials of the local bit lines 241a1 to 241an, independent of load on the global bit lines 24g1 to 24gn. Therefore, even if there are differences in load on the global bit lines 24g1 to 24gn, the same potential is supplied to the twin sense amplifiers 27a1 to 27a(n−1) when a potential corresponding to the same logic value is transmitted. Herewith, it is possible to control the occurrence of data determination errors made by the twin sense amplifiers 27a1 to 27a(n−1).

In addition, the provision of a plurality of PSA units (the PSA units 25a and 25b of FIG. 9) prevents, for example, attenuation of read potentials due to increases in the length of bit lines resulting from increased size of memory cell arrays, thus supporting large-scale expansion of the semiconductor memory device 20. Note here that three or more PSA units 25a and 25b may be provided.

Further, in the pre-sense amplifier 25a1 of FIG. 11, for example, the gain is smaller than 1. Although the global bit line 24g1 is long in length and has large wiring capacity, the potential of the global bit line 24g1 is converted by the pre-sense amplifier 25a1 into a level having an amplitude smaller than that of the potential propagating through the local bit line 241a1. It is thus possible to reduce current consumption.

Having described aspects of the semiconductor memory device based on the embodiments above, they are merely examples and the particular details of these illustrative examples shall not be construed as limitations.

According to an aspect, it is possible to control the occurrence of data determination errors.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor memory device comprising:
a memory cell array configured to include a first memory cell holding data of a first logic value and a second logic value, a plurality of second memory cells each holding data of the first logic value or the second logic value, two first bit lines connected to the first memory cell, and a plurality of second bit lines each connected to one of the plurality of second memory cells;
a plurality of pre-sense amplifiers, each configured to produce, in a read operation, an output potential obtained by resistively dividing a power supply voltage based on a potential of one of the two first bit lines or one of the plurality of second bit lines; and
a plurality of twin sense amplifiers, each configured to output data determination results based on two reference potentials and a data potential in the read operation, the two reference potentials being the output potentials produced based on the potentials of the two first bit lines, the data potential being the output potential produced based on the potential of one of the plurality of second bit lines.

2. The semiconductor memory device according to claim 1, wherein:
each of the plurality of pre-sense amplifiers includes:
a p-channel field-effect transistor having a first gate connected to one of the two first bit lines or one of the plurality of second bit lines, a first source to which the power supply voltage is applied, and a first drain set at the produced output potential, and
an n-channel field-effect transistor having a second drain and a second gate connected to the first drain and a second source set at a ground potential.

3. The semiconductor memory device according to claim 1, wherein:
each of the plurality of pre-sense amplifiers includes:
a p-channel field-effect transistor having a first source to which the power supply voltage is applied and a first drain and a first gate set at the produced output potential, and
an n-channel field-effect transistor having a second gate connected to one of the two first bit lines or one of the plurality of second bit lines, a second drain connected to the first drain and the first gate, and a second source set at a ground potential.

4. The semiconductor memory device according to claim 1, wherein:
each of the plurality of pre-sense amplifiers includes:
a p-channel first field-effect transistor having a first gate connected to one of the two first bit lines or one of the plurality of second bit lines, a first source to which the power supply voltage is applied, and a first drain,
an n-channel second field-effect transistor having a second drain and a second gate connected to the first drain and a second source set at a ground potential,
a p-channel third field-effect transistor having a third source to which the power supply voltage is applied, and a third gate and a third drain set at the produced output potential, and
an n-channel fourth field-effect transistor having a fourth drain connected to the third gate and the third drain, a fourth gate connected to the first drain, the second drain, and the second gate, and a fourth source set at the ground potential.

5. The semiconductor memory device according to claim 1, wherein:
each of the plurality of pre-sense amplifiers includes:
a p-channel first field-effect transistor having a first source to which the power supply voltage is applied, a first gate, and a first drain connected to the first gate,
an n-channel second field-effect transistor having a second drain connected to the first gate and the first drain, a second gate connected to one of the two first bit lines or one of the plurality of second bit lines, and a second source set at a ground potential, a p-channel third field-effect transistor having a third source to which the power supply voltage is applied, a third gate connected to the first gate, the first drain, and the second drain, and a third drain set at the produced output potential, and an n-channel fourth field-effect transistor having a fourth drain and a fourth gate connected to the third drain and a fourth source set at the ground potential.

6. The semiconductor memory device according to claim 1, wherein:

the produced output potential is supplied to one of the plurality of twin sense amplifiers via one of fourth bit lines each connected to one of the plurality of pre-sense amplifiers.

7. The semiconductor memory device according to claim 6, further comprising:

a plurality of pre-sense amplifier units, each configured to include the plurality of pre-sense amplifiers and share the fourth bit lines, wherein the memory cell array includes a plurality of regions, in each of which the two first bit lines and the plurality of second bit lines are provided independently, and the plurality of pre-sense amplifiers included in each of the plurality of pre-sense amplifier units is connected to the two first bit lines and the plurality of second bit lines provided in one of the plurality of regions.

8. The semiconductor memory device according to claim 1, wherein:

each of the first memory cell and the plurality of second memory cells includes a ferroelectric capacitor.

9. The semiconductor memory device according to claim 1, wherein:

the first memory cell is a 2T2C memory cell and the plurality of second memory cells are 1T1C memory cells.

* * * * *